US008578256B2

(12) United States Patent
Graef

(10) Patent No.: US 8,578,256 B2
(45) Date of Patent: Nov. 5, 2013

(54) LOW-LATENCY DECODER

(75) Inventor: Nils Graef, Milpitas, CA (US)

(73) Assignee: Agere Systems LLC, Allentown, PA (US)

( * ) Notice: Subject to any disclaimer, the term of this patent is extended or adjusted under 35 U.S.C. 154(b) by 342 days.

(21) Appl. No.: 12/427,786

(22) Filed: Apr. 22, 2009

(65) Prior Publication Data

US 2010/0275088 A1    Oct. 28, 2010

(51) Int. Cl.
G06F 11/10    (2006.01)

(52) U.S. Cl.
USPC .......................................................... 714/801

(58) Field of Classification Search
USPC .......................................................... 714/801
See application file for complete search history.

(56) References Cited

U.S. PATENT DOCUMENTS

| 7,181,676 | B2 | 2/2007 | Hocevar | |
| 2005/0018793 | A1* | 1/2005 | Learned | 375/340 |
| 2005/0193320 | A1 | 9/2005 | Varnica et al. | |
| 2005/0204255 | A1 | 9/2005 | Yeh et al. | |
| 2005/0283707 | A1 | 12/2005 | Sharon et al. | |
| 2006/0107181 | A1 | 5/2006 | Dave et al. | |
| 2006/0285852 | A1 | 12/2006 | Xi et al. | |
| 2007/0011568 | A1* | 1/2007 | Hocevar | 714/758 |
| 2007/0011569 | A1 | 1/2007 | Vila Casado et al. | |
| 2007/0011573 | A1 | 1/2007 | Farjadrad et al. | |
| 2007/0011586 | A1 | 1/2007 | Belogolovyi et al. | |
| 2007/0044006 | A1 | 2/2007 | Yang et al. | |
| 2007/0071009 | A1 | 3/2007 | Nagaraj et al. | |
| 2007/0124652 | A1 | 5/2007 | Litsyn et al. | |
| 2007/0147481 | A1 | 6/2007 | Bottomley et al. | |
| 2007/0162788 | A1 | 7/2007 | Moelker | |
| 2007/0234178 | A1 | 10/2007 | Richardson et al. | |
| 2007/0234184 | A1 | 10/2007 | Richardson | |

(Continued)

FOREIGN PATENT DOCUMENTS

WO    WO 2010/019168 A1    2/2010

OTHER PUBLICATIONS

K. Gunnam et al., "Value-Reuse Properties of Min-Sum for GF(q)" (dated Oct. 2006) Dept. of ECE, Texas A&M University Technical Note, published about Aug. 2010.

(Continued)

*Primary Examiner* — Scott Baderman
*Assistant Examiner* — Jigar Patel
(74) *Attorney, Agent, or Firm* — Mendelsohn, Drucker & Dunleavy, P.C.; Craig M. Brown; Steve Mendelsohn

(57) ABSTRACT

In one embodiment, a signal-processing receiver has an upstream processor and a low-density parity-check (LDPC) decoder for decoding LDPC-encoded codewords. The upstream processor generates a soft-output value for each bit of the received codewords. The LDPC decoder is implemented to process the soft-output values without having to wait until all of the soft-output values are generated for the current codeword. Further, the LDPC code used to encode the codewords is arranged to support such processing. By processing the soft-output values without having to wait until all of the soft-output values are generated for the current codeword, receivers of the present invention may have a lower latency and higher throughput than prior-art receivers that wait until all of the soft-output values are generated prior to performing LDPC decoding. In another embodiment, the LDPC decoder processes the soft-output values as soon as, and in the order that, they are generated.

17 Claims, 8 Drawing Sheets

(56) References Cited

U.S. PATENT DOCUMENTS

| | | |
|---|---|---|
| 2008/0082868 A1 | 4/2008 | Tran et al. |
| 2008/0104485 A1 | 5/2008 | Lyakh et al. |
| 2008/0109701 A1 | 5/2008 | Yu et al. |
| 2008/0126910 A1 | 5/2008 | Venkatesan et al. |
| 2008/0148129 A1 | 6/2008 | Moon |
| 2008/0163032 A1 | 7/2008 | Lastras-Montano |
| 2008/0235561 A1 | 9/2008 | Yang |
| 2008/0276156 A1 | 11/2008 | Gunnam et al. ............. 714/801 |
| 2008/0301521 A1 | 12/2008 | Gunnam et al. ............. 714/757 |
| 2009/0100311 A1* | 4/2009 | Song et al. .................... 714/752 |
| 2009/0273492 A1 | 11/2009 | Yang et al. |
| 2010/0042806 A1 | 2/2010 | Gunnam |
| 2010/0042890 A1 | 2/2010 | Gunnam |
| 2010/0241921 A1* | 9/2010 | Gunnam ....................... 714/752 |

OTHER PUBLICATIONS

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Kiran Gunnam, Gwan Choi, Mark Yeary—"An LDPC decoding schedule for memory acces reduction", IEEE International Conference on Acoustics, Speech, and Signal Processing (ICASSP) 2004, pp. 173-176, vol. I5.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, pp. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,pp. 90.

T. Richardson and R. Urbanke—"Modern Coding Theory", Cambridge University Press, Preliminary version—Oct. 18, 2007, pp. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. Mackay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981, pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

(56) References Cited

OTHER PUBLICATIONS

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Gunnam, Kiran K., et al. "Decoding of Quasi-cyclic LDPC Codes Using an On-the-Fly Computation," Signals, Systems and Computers, 2006, ACSSC '06. Fortieth Asilomar Conference on Oct.-Nov. 2006;pp. 1192-1197.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

\* cited by examiner

300

$$H = \begin{bmatrix} H_{LAYER\,1} \\ H_{LAYER\,2} \\ H_{LAYER\,3} \\ H_{LAYER\,4} \end{bmatrix}$$

FIG. 3A $$H_{LAYER\,1} = \begin{bmatrix} I_{1,1} & \cdots & I_{1,11} & O_{1,12} & \cdots & O_{1,22} & \cdots & O_{1,1365} & O_{1,1375} \\ O_{2,1} & \cdots & O_{2,11} & I_{2,12} & \cdots & I_{2,22} & \cdots & O_{2,1365} & O_{2,1375} \\ \cdots & \cdots & \cdots & \cdots & \cdots & \cdots & \cdots & \cdots & \cdots \\ O_{125,1} & \cdots & O_{125,11} & O_{125,12} & \cdots & O_{125,22} & \cdots & I_{125,1365} & I_{125,1375} \end{bmatrix}$$

LOW-LATENCY DECODER

BACKGROUND OF THE INVENTION

1. Field of the Invention

The present invention relates to signal processing, and, in particular, to error-correction encoding and decoding techniques such as low-density parity-check (LDPC) encoding and decoding.

2. Description of the Related Art

In communicating a data signal from a transmitter to a receiver, noise may be introduced into the signal causing the signal to be distorted upon arrival at the receiver. As a result of this distortion, the receiver might not correctly recover the transmitted information. In such cases, the transmitted signal may need to be retransmitted so that the receiver may have another opportunity to recover the transmitted information. However, resending the transmitted signal increases the amount of time that it takes to provide the transmitted information to the user. To reduce the frequency of retransmissions, and therefore reduce the amount of time that it takes for the transmitted information to be delivered to the user, the transmitter may encode the transmitted signal using a channel-coding scheme. A channel-coding scheme adds redundant or additional data to the signal to be transmitted. The receiver then uses this redundant or additional data to detect and/or correct errors. If the channel-coding scheme is effective, then the transmitted data may be recovered correctly without the need to retransmit the data.

One particular channel-coding scheme that has received attention in recent years is low-density parity-check (LDPC) coding. LDPC codes, which are typically defined using parity-check matrices, provide excellent performance that comes relatively close to the Shannon limit. A discussion of LDPC codes and LDPC decoding is presented in Hocevar, "A Reduced Complexity Decoder Architecture via Layered Decoding of LDPC Codes," Signal Processing Systems, IEEE Workshop on Signal Processing Systems Design and Implementation, pgs 107-112, October 2004, the teachings all of which are incorporated herein by reference in their entirety.

SUMMARY OF THE INVENTION

In one embodiment, the present invention is a method for decoding an error-correction (EC) encoded codeword. The method receives values corresponding to bits of the EC-encoded codeword. Check-node updates are performed based on the bits of the codeword to generate check-node messages. The check-node updates are initiated before all of the values corresponding to bits of the EC-encoded codeword are generated. The values corresponding to the bits based on the check-node messages are updated to generate updated values, and the method determines whether the updated values correspond to a valid codeword.

In another embodiment, the present invention is an apparatus for performing the method described above. The apparatus comprises a decoder for decoding an EC-encoded codeword. The decoder comprises (i) a check-node unit that performs the check-node updates, (ii) a combiner that generates the updated values, and (ii) a parity-check calculator that determines whether the updated values correspond to a valid codeword.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 3A shows a parity-check matrix representation of an LDPC code 300 according to one embodiment of the present invention that may be used to encode codewords decoded by receiver 200 of FIG. 2;

FIG. 3B shows an exemplary first layer of the H-matrix of FIG. 3A according to one embodiment of the present invention;

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
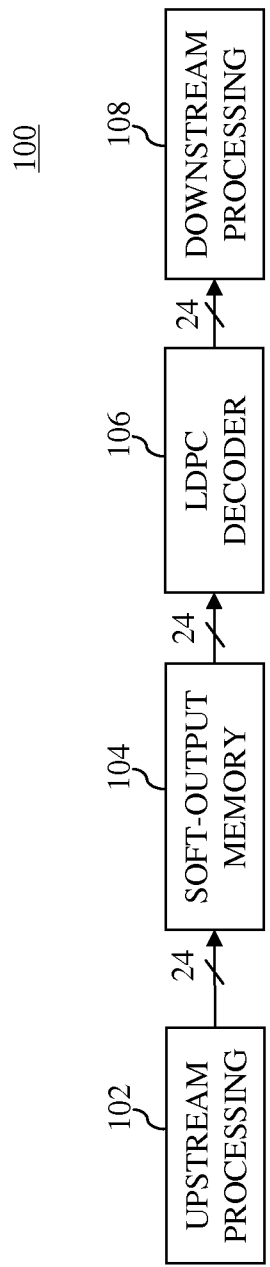
FIG. 1 shows a simplified block diagram of a conventional signal-processing receiver that may be used to receive an LDPC-encoded codeword.

FIG. 1 shows a simplified block diagram of one implementation of a conventional signal-processing receiver 100 that may be used to receive an LDPC-encoded codeword. Receiver 100 may be implemented in a variety of different applications such as hard-disc drive (HDD) systems, digital audio broadcast (DAB) systems, and WIFI systems. Receiver 100 receives LDPC-encoded codewords and processes the codewords using upstream processing 102, which may perform, for example, radio-frequency processing, analog-to-digital conversion, equalization, channel detection such as Viterbi detection, or other processing suitable for generating soft-output values and/or hard-decision bits. The processing performed by upstream processing 102 may depend on the particular application in which receiver 100 is implemented. Suppose for the following discussion that each of the codewords received by receiver 100 has a length of 33,000 bits and that upstream processing 102 generates one five-bit soft-output value for each of the 33,000 bits. Further, suppose that upstream processing 102 outputs the 33,000 five-bit soft-output values at a rate of 24 soft values per clock cycle to soft-output memory 104.

Soft-output memory 104 stores all 33,000 five-bit soft-output values, and provides the soft-output values to LDPC decoder 106 at a rate of 24 soft values per clock cycle. The soft-output values are provided in an order that is different from the order in which they are received by soft-output memory 104. The order in which they are output corresponds to the structure of the LDPC code, and consequently, the order in which they are processed by LDPC decoder 106. To provide the soft-output values in a different order, soft-output memory 104 is implemented with logic that enables it to determine which soft-output values to provide during each clock cycle.

LDPC decoder 106 decodes the soft-output values in the order that they are received from soft-output memory 104, and, if decoding is successful, LDPC decoder 106 outputs a hard-decision bit for each of the 33,000 bits of the codeword at a rate of 24 hard-decision bits per clock cycle. The hard-decision bits are processed by downstream processing 108, which may perform, for example, digital-to-analog conversion or other processing suitable for the particular application in which receiver 100 is implemented.

Figure 2:
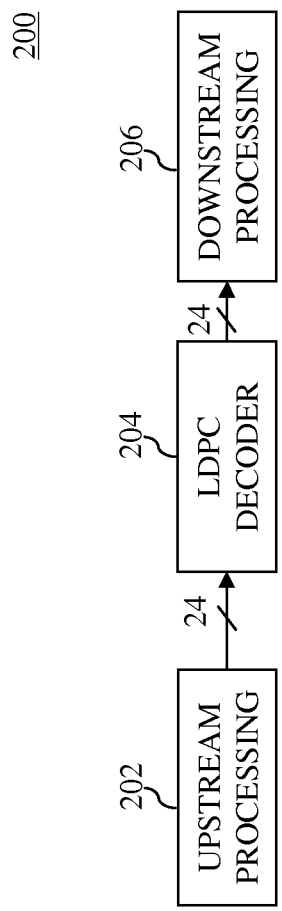
FIG. 2 shows a simplified block diagram of a signal-processing receiver according to one embodiment of the present invention.

FIG. 2 shows a simplified block diagram of a signal-processing receiver 200 according to one embodiment of the present invention. Receiver 200 has upstream processing 202 and downstream processing 206, which may be implemented in a manner similar to that of the equivalent processing of signal-processing receiver 100 of FIG. 1. Receiver 200 also has LDPC decoder 204, which is capable of processing soft-output values, without having to wait until all of the soft-output values are generated for the current codeword. In this particular embodiment, LDPC decoder 204 is capable of processing the soft-output values as soon as they are generated by upstream processing 202, and in the order in which they are generated by upstream processing 202. In other embodiments, LDPC decoders of the present invention may process the soft-output values after some delay, albeit, without having to wait until all of the soft-output values are generated for the current codeword.

In receiver 200, all 33,000 soft-output values are provided from upstream processing 202 to LDPC decoder 204 in 1,375 clock cycles (i.e., 33,000 values/24 values per clock cycle). In receiver 100 of FIG. 1, on the other hand, it takes 2,750 clock cycles for all 33,000 soft-output values to be provided from upstream processing 102 to LDPC decoder 106. Upstream processing 102 provides all 33,000 soft-output values to soft-output memory 104 during 1,375 clock cycles, and soft-output memory 104 provides all 33,000 soft-values to LDPC decoder 106 during the next 1,375 clock cycles. Since LDPC decoder 204 receives the soft-output values in 1,375 clock cycles, as opposed to 2,750 clock cycles, receiver 200 may have a lower latency and higher throughput than receiver 100. Further, since receiver 200 does not implement soft-output memory, the chip area occupied by receiver 200 may be smaller than that of receiver 100.

The order in which the soft-output values are processed by an LDPC decoder generally depends on the structure of the LDPC code. Conventional LDPC codes do not allow for processing of soft-output values in the order in which they are output from the upstream processing. Rather, as described above in relation to FIG. 1, conventional receivers store the soft-output values and provide these values to conventional LDPC decoders in a different order from which they were received. LDPC codes employed by receiver 200, on the other hand, may be structured, as discussed below, such that soft-output values are processed by LDPC decoder 204 in the order that they are output from the upstream processing.

FIG. 3A shows a parity-check matrix representation of an LDPC code 300 according to one embodiment of the present invention that may be used to encode codewords decoded by receiver 200 of FIG. 2. Parity-check matrix 300, commonly referred to as an H-matrix, is composed of (24×24) sub-matrices, each of which may be either (i) a zero matrix, (ii) an identity matrix, or (iii) a circulant that is obtained by cyclically shifting an identity matrix. The (24×24) sub-matrices are arranged in 1,375 block columns and 500 block rows, such that H-matrix 300 comprises (i) 24×1,375=33,000 total columns, each of which corresponds to an $n^{th}$ variable node, where n ranges from 1 to 33,000, and (ii) 24×500=12,000 total rows, each of which corresponds to an $m^{th}$ check node, where m ranges from 1 to 12,000. The sub-matrices are arranged such that the hamming weight $w_r$ for each row is equal to 11 and the hamming weight $w_c$ for each column is equal to four. Further, to support a layered-decoding algorithm, the 500 block rows are divided into four layers ($H_{LAYER1}$, $H_{LAYER2}$, $H_{LAYER3}$, and $H_{LAYER4}$) such that (i) each layer comprises 125 block rows and (ii) each column of the layers has a hamming weight equal to one (i.e., ($w_c$=4)÷4 layers=1 per layer).

FIG. 3B shows an exemplary first layer ($H_{LAYER1}$) of H-matrix 300 according to one embodiment of the present invention. The first layer ($H_{LAYER1}$) is arranged such that soft-output values may be processed by the LDPC decoder in the order that they are output from the upstream processing, as discussed below. In the first block row, the (24×24) sub-matrices are arranged such that the $1^{st}$ through $11^{th}$ sub-matrices are identity matrices ($I_{1,1}$ to $I_{1,11}$), and the $12^{th}$ through $375^{th}$ sub-matrices are zero matrices ($0_{1,12}$ to $0_{1,1375}$). In the second block row, the sub-matrices are arranged such that the $1^{st}$ through $11^{th}$ sub-matrices are zero matrices ($0_{2,1}$ to $0_{2,11}$), the $12^{th}$ through $22^{nd}$ sub-matrices are identity matrices ($I_{2,12}$ to $I_{2,22}$), and the $23^{rd}$ through $1,375^{th}$ sub-matrices are zero matrices ($0_{1,23}$ to $0_{1,1375}$). This pattern is repeated until the last block row in which the $1^{st}$ through $1,364^{th}$ sub-matrices are zero matrices ($0_{125,1}$ to $0_{125,1364}$) and the $1,365^{th}$ through 1,375th sub-matrices are identity matrices ($I_{1,1365}$ to $I_{1,1375}$).

The arrangement of the first layer ($H_{LAYER1}$) may be varied from one embodiment of the present invention to the next to generate different LDPC codes. Various embodiments of the first layer ($H_{LAYER1}$), such as the embodiment of FIG. 3B, may support decoding of soft-output values as soon as they are generated, and various other embodiments may support decoding of soft-output values, perhaps with some delay, but without having to wait until all of the soft-output values are generated.

The arrangement of each of the second through fourth layers ($H_{LAYER2}$-$H_{LAYER4}$) of H-matrix 300 may be obtained by implementing each (24×24) sub-matrix of the second through fourth layers ($H_{LAYER2}$-$H_{LAYER4}$) as a zero matrix, an identity matrix, or a circulant, such that the hamming weight $w_r$ of each layer row is 11 and the hamming weight $w_c$ of each layer column is one. The arrangement of each of the second through fourth layers ($H_{LAYER2}$-$H_{LAYER4}$) of H-matrix 300 may differ from that of the first layer ($H_{LAYER1}$) and may be different from one implementation to the next to generate different LDPC codes. These layers may be made different, for example, by varying the locations of the zero matrices, identity matrices, and circulants. Additionally, one or more of the second through fourth layers ($H_{LAYER2}$-$H_{LAYER4}$) may be arranged in the same manner as the first layer. Note that LDPC H-matrices of the present invention may also be generated by permutating rows and columns of prior-art H-matrices. Typically, the error-correction capabilities of an LDPC matrix of the present invention that is obtained by permutating rows and columns of a prior-art H-matrix is the same as that of the prior-art H-matrix.

Figure 4:
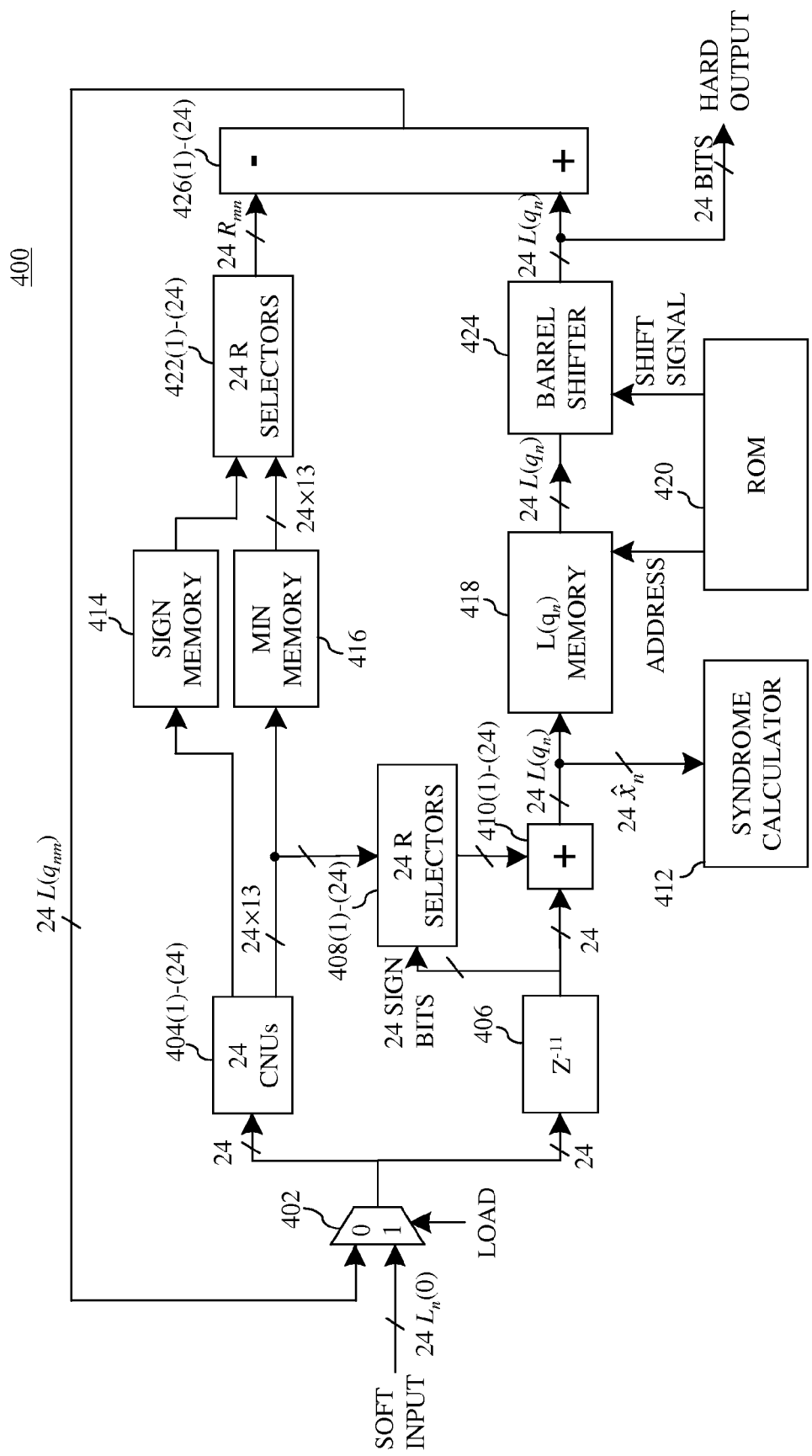
FIG. 4 shows a simplified block diagram of a layered LDPC decoder according to one embodiment of the present invention that may be used to implement the LDPC decoder of the receiver of FIG. 2.

FIG. 4 shows a simplified block diagram of a layered LDPC decoder 400 according to one embodiment of the present invention that may be used to implement LDPC decoder 204 of FIG. 2. LDPC decoder 400 decodes codewords encoded using H-matrix 300 of FIG. 3. For each codeword received, LDPC decoder 400 receives 33,000 soft-output values (e.g., log-likelihood ratios (LLR)) $L_n^{(0)}$ from upstream processing such as upstream processing 202 of FIG. 2. Each soft-output value $L_n^{(0)}$ corresponds to one bit of the codeword, and each codeword is decoded iteratively using a layered message-passing algorithm. For this discussion, suppose that each message, including each soft-output value $L_n^{(0)}$, comprises five bits (i.e., a sign-bit hard-decision value and a four-bit confidence value).

LDPC decoder 400 has multiplexer 402 which receives (i) the 33,000 five-bit soft-output values $L_n^{(0)}$ at a rate of 24 soft-output values $L_n^{(0)}$ per clock cycle via its lower input and (ii) 33,000 variable-node messages $L(q_{nm})$ at a rate of 24 variable-node messages $L(q_{nm})$ per clock cycle via its upper input. The variable-node (i.e., column) messages $L(q_{nm})$ are variable-node messages $L(q_{nm})$ generated for a previously considered codeword, previously considered iteration, or previously considered layer. During the first 1,375 clock cycles, multiplexer 402 selects the sets of 24 soft-output values $L_n^{(0)}$ that it receives to output to (i) delay buffer 406, which delays each set of 24 soft-output values $L_n^{(0)}$ by eleven clock cycles, and (ii) check-node units (CNUs) 404(1)-(24). The sets of 24 soft-output values $L_n^{(0)}$ are selected by asserting (i.e., setting equal to 1) the control signal (LOAD) that is provided to the control port of multiplexer 402. Each set of 24 soft-output values $L^{(0)}$ is output such that each of the 24 soft-output values $L_n^{(0)}$ is provided to a different CNU 404. During subsequent iterations, multiplexer 402 selects the 24 variable-node messages $L(q_{nm})$ that it receives to output to (i) CNUs 404(1)-(24) and (ii) delay buffer 406. For the following discussion, it will be understood that any reference to variable-node messages $L(q_{nm})$, applies to soft-output values $L_n^{(0)}$ during the first 1,375 clock cycles.

LDPC decoder 400 performs the check-node (i.e., row) updates for H-matrix 300 of FIG. 3A, one block row at a time using (i) CNUs 404(1)-(24) and (ii) R selectors 408(1)-(24). Note that, R selectors 422(1)-(24) are also used to update check-node messages, albeit later in the decoding process, as discussed below. CNUs 404(1)-(24) and R selectors 408(1)-(24) perform the check-node updates for the first block row of H-matrix 300 (i.e., $I_{1,1}, \ldots, I_{1,11}$) during the first 11 clock cycles, followed by the check-node updates for the second block row (i.e., $I_{2,12}, \ldots, I_{2,22}$) during the $12^{th}$ through $22^{nd}$ clock cycles, followed by the check-node updates for the third block row (i.e., $I_{3,23}, \ldots, I_{3,33}$) during the $23^{rd}$ through $33^{rd}$ clock cycles, and so on. Each CNU 404, together with a corresponding R selector 408, performs the check-node updates for a different one of the 24 check nodes (i.e., rows) of each block row.

Each CNU 404 and R selector 408 pair (i) receives a number of variable-node messages $L(q_{nm})$ equal to the hamming weight $w_r$ of a row of H-matrix 300 (i.e., 11) at a rate of one variable-node message $L(q_{nm})$ per clock cycle and (ii) generates $w_r$ check-node messages. Each check-node message may be generated using a suitable check-node algorithm, such as the min-sum algorithm, characterized by Equations (1), (2), and (3) shown below:

$$R_{mn} = s_{mn} \kappa_{mn} \qquad (1)$$

$$\kappa_{mn} = |R_{mn}| = \min_{n' \in N(m)/n} |L(q_{n'm})| \qquad (2)$$

$$s_{mn} = \left( \prod_{n' \in N(m)/n} \text{sign}(L(q_{n'm})) \right), \qquad (3)$$

where (i) $R_{mn}$ represents the check-node message corresponding to $m^{th}$ check node (i.e., row) and the $n^{th}$ variable node (i.e., column) of H-matrix 300, (ii) $L(q_{nm})$ represents the variable-node message corresponding to the $n^{th}$ variable node and the $m^{th}$ check node of H-matrix 300, and (iii) the function sign indicates that the multiplication operation (i.e., $\Pi$) is performed on the signs of variable-node messages $L(q_{nm})$. Suppose that n' is a variable node in the set N(m)/n of all variable nodes connected to the $m^{th}$ check node except for the $n^{th}$ variable node (i.e., n'∈ N(m)/n). The CNU 404 and R selector 408 pair corresponding to the $m^{th}$ check node (i.e., row), generates check-node message $R_{mn}$ based on all variable-node messages $L(q_{nm})$ in the set N(m)/n. Thus, in the embodiment of FIG. 4, each check-node message is generated based on N(m)/n=ten variable-node messages $L(q_{nm})$ (i.e., $w_r-1=11-1$). Note that, for the first 1,375 clock cycles, soft-output values $L_n^{(0)}$ are used in Equation (1) in lieu of variable-node messages $L(q_{nm})$ (i.e., $L(q_{nm})=L_n^{(0)}$).

The min-sum algorithm described in Equation (1) may be simplified using a value-reuse technique. For example, for each check node (i.e., row) of H-matrix 300, each of the 11 check-node messages $R_{mn}$ are generated using a set N(m)/n of ten variable-node messages $L(q_{nm})$ (one message is excluded as described above). For ten of these 11 check-node messages $R_{mn}$, the minimum magnitude of the variable-node messages $L(q_{nm})$ generated using Equation (1) will be the same. For one of these check-node messages $R_{mn}$, the minimum magnitude of the variable-node messages $L(q_{nm})$ will be the second-smallest magnitude of the variable-node messages $L(q_{nm})$ because the minimum magnitude of the variable-node messages $L(q_{nm})$ will be excluded from the calculation as described above. Thus, it is not necessary to perform Equation (1) 11 times for each CNU 404 and R selector 408 pair. Rather, as discussed below in relation to FIG. 5, each CNU 404 may store the two variable-node messages $L(q_{nm})$ with the first- and second-smallest magnitudes (MIN1 and MIN2), and store an index value (MIN1_ID) corresponding to the first-smallest magnitude (MIN1) that may be used to match the second-smallest magnitude (MIN2) with the correct check-node messages $R_{mn}$ (i.e., the check-node message $R_{mn}$ that excludes the minimum magnitude). Then, as discussed below in relation to FIG. 6, the corresponding R selector 408 may generate each of the 11 check-node messages $R_{mn}$ as shown in Equation (1) by (i) selecting either the minimum magnitude (MIN1) or the second-smallest magnitude (MIN2) and (ii) multiplying the selected magnitude value by a sign product $s_{mn}$ generated as shown in Equation (2).

Figure 5:
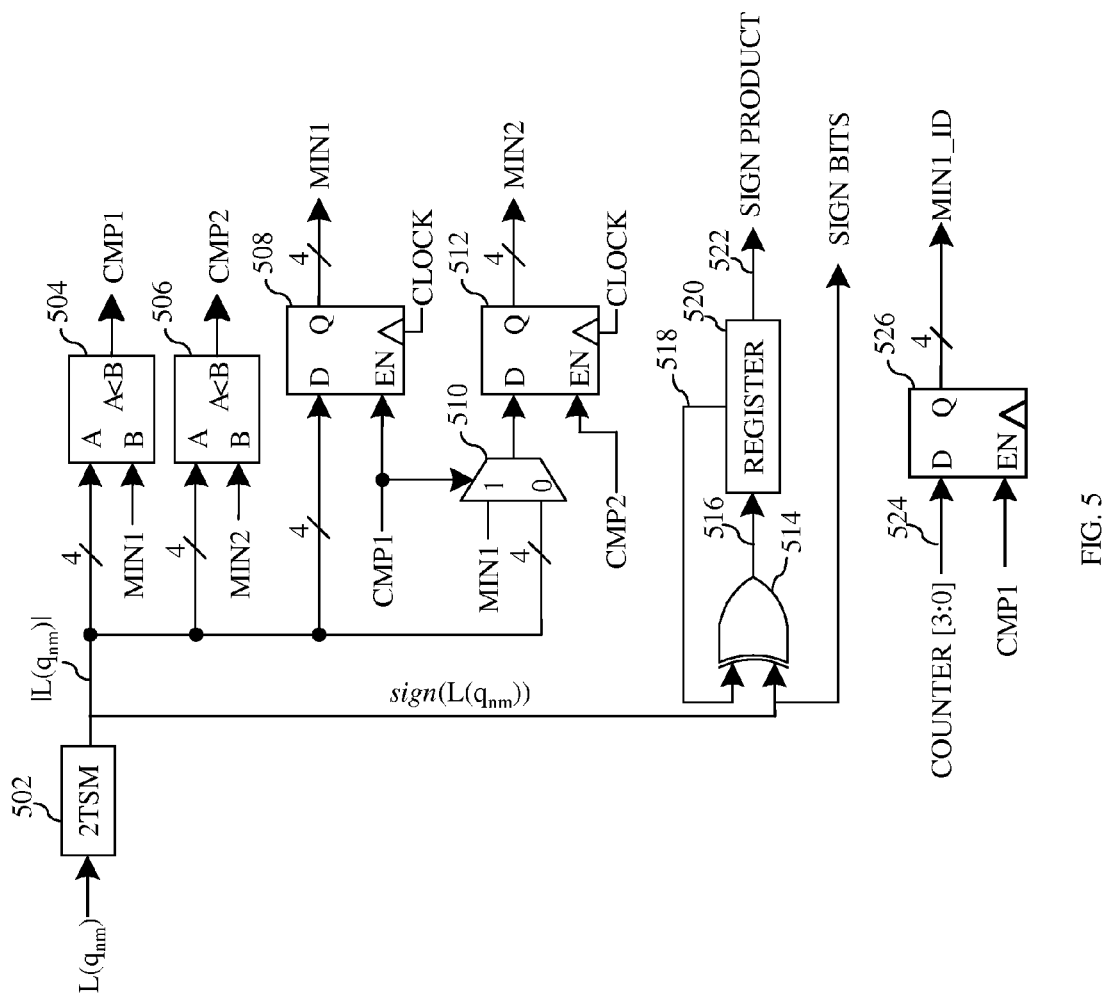
FIG. 5 shows a simplified block diagram of a CNU according to one embodiment of the present invention which may be used to implement each of the 24 CNUs of the LDPC decoder of FIG. 4.

FIG. 5 shows a simplified block diagram of a CNU 500 according to one embodiment of the present invention, which may be used to implement each of the CNUs 404 of FIG. 4. CNU 500 receives 11 five-bit variable-node messages $L(q_{nm})$ in two's-complement format at a rate of one message per clock cycle. Each variable-node message $L(q_{nm})$ is converted from two's-complement format to a five-bit sign-magnitude value using two's-complement-to-sign-magnitude (2TSM) converter 502. The magnitude value $|L(q_{nm})|$ (i.e., the four least significant bits (LSBs) of the resulting sign-magnitude variable-node message $L(q_{nm})$) is provided to the upper inputs of comparators 504 and 506, the data port (D) of four-bit register 508, and the lower input of multiplexer 510.

Comparator 504 receives a first-minimum magnitude value (MIN1) from four-bit register 508 at its lower input and compares MIN1 to magnitude value $|L(q_{nm})|$51. If magnitude value $|L(q_{nm})|$ is less than MIN1, then the first comparison signal (CMP1) is asserted (i.e., set equal to 1). Otherwise, comparison signal CMP1 is de-asserted. Similarly, comparator 506 receives a second-minimum magnitude value (MIN2) from four-bit register 512 at its lower input and compares MIN2 to magnitude value $|L(q_{nm})|$. If magnitude value $|L(q_{nm})|$ is less than MIN2, then the second comparison signal (CMP2) is asserted. Otherwise, comparison signal CMP2 is de-asserted. At the beginning of each set of check-node updates, MIN1 and MIN2 may be set to suitably large values (i.e., binary 1111).

Four-bit registers 508, 512, and 526, which store MIN1, MIN2, and a counter value (MIN1_ID) corresponding to MIN1, respectively, each comprise four flip-flops, one for each bit of the value that it stores. Each flip-flop, which has a data port (D), an enable port (EN), a clock-signal input port (CLOCK), and an output port (Q), changes its stored value to capture data provided to its data port (D) when (1) its enable port (EN) is enabled and (2) the clock signal is at a rising edge. When either of these two conditions is not satisfied, the value stored by the flip-flop is not changed, and the flip-flop continues to output the same bit value from its output port (Q). For ease of discussion, four-bit registers 508, 512, and 526 are discussed in terms of having one four-bit data port (D), one enable port (EN), one clock-signal input port (CLOCK), and one four-bit output port (Q).

TABLE I

CNU 500 MIN1 and MIN2 Logic Table

| CMP1 | CMP2 | Register 508 | Register 512 | Register 526 |
|---|---|---|---|---|
| 1 ($\|L(q_{nm})\| < $ MIN1) | 1 ($\|L(q_{nm})\| < $ MIN2) | $\|L(q_{nm})\|$ | MIN1 | Counter 524 |
| 0 ($\|L(q_{nm})\| \geq $ MIN1) | 1 ($\|L(q_{nm})\| < $ MIN2) | MIN1 | $\|L(q_{nm})\|$ | N/C |
| 0 ($\|L(q_{nm})\| \geq $ MIN1) | 0 ($\|L(q_{nm})\| \geq $ MIN2) | MIN1 | MIN2 | N/C |
| 1 ($\|L(q_{nm})\| < $ MIN1) | 0 ($\|L(q_{nm})\| \geq $ MIN2) | N/A | N/A | N/A |

To further understand the operation of CNU 500, consider the logic table of Table I. As shown in row 1, if comparison signals CMP1 and CMP2 are both asserted (i.e., $|L(q_{nm})|<$M1 and M2), then (i) the MIN1 value previously stored in register 508 is replaced with magnitude value $|L(q_{nm})|$, (ii) the MIN2 value previously stored in register 512 is replaced with the MIN1 value previously stored in register 508, and (iii) the MIN1_ID previously stored in register 526 is replaced with current counter value 524. Referring to FIG. 5, four-bit register 508 receives comparison signal CMP1 via its enable port (EN). Since comparison signal CMP1 is asserted, four-bit register 508 replaces the previously stored MIN1 value with magnitude value $|L(q_{nm})|$, which is received via its data port (D). In addition to storing the new MIN1 value, register 526 is enabled using comparison signal CMP1, and the current counter value 524 replaces the counter value (MIN1_ID) that corresponded to the previously stored in MIN1 value. The MIN2 value previously stored in four-bit register 512 is replaced using multiplexer 510 and control signal CMP2. Multiplexer 510, which receives (i) asserted control signal CMP1 via its control port and (ii) the MIN1 value previously stored in four-bit register 508 via its upper input, selects the previously stored MIN1 value to output to the data port (D) of four-bit register 512. Four-bit register 512 is then enabled by CMP2.

As shown in row 2 of Table I, if comparison signal CMP1 is de-asserted and comparison signal CMP2 is asserted (i.e., $M2>|L(q_{nm})|\geq M1$), then (i) the MIN1 value stored in four-bit register 508 is not changed, (ii) the MIN2 value stored in four-bit register 512 is replaced with magnitude value $|L(q_{nm})|$, and the MIN1_ID previously stored in register 526 is not changed (N/C). Referring to FIG. 5, since comparison signal CMP1 is de-asserted, multiplexer 510 outputs its lower input, magnitude value $|L(q_{nm})|$, to the data input port (D) of four-bit register 512. Control signal CMP2 is asserted to enable four-bit register 512, which stores magnitude value $|L(q_{nm})|$ as the new MIN2 value.

As shown in row 3 of Table I, if comparison signals CMP1 and CMP2 are both de-asserted (i.e., $|L(q_{nm})|\geq$M1 and M2), then (i) registers 508, 512, and 526 are not enabled, and the previously stored MIN1, MIN2, and MIN1_ID values are not changed. Note that it is not possible that comparison signal CMP1 will be asserted and comparison signal CMP2 will be de-asserted because this would indicate that magnitude value $|L(q_{nm})|$ is smaller than first-minimum magnitude value MIN1 but larger than second-minimum magnitude value MIN2.

In addition to determining MIN1 and MIN2, CNU 500 (i) provides the 11 sign bits (i.e., the most significant bits (MSBs) of the 11 sign-magnitude variable-node messages $L(q_{nm})$) to sign memory 414 of FIG. 4 at a rate of one sign bit per clock cycle, and (ii) generates a product 522 of all 11 sign bits. During each clock cycle, XOR gate 514 receives (i) a running product 518 of the sign bits from register 520 and (ii) a sign bit, and outputs an updated running product 516. Running product 518 may be initialized to 0. The updated running product 516 replaces the previous running product 518 in register 520. This process is performed for all 11 sign bits during 11 clock cycles to generate a final sign product 522, which is output to R selectors 408(1)-(24) and min memory 416 of FIG. 4.

Referring back to FIG. 4, LDPC decoder 400 has two sets of 24 R selectors (408(1)-(24) and 422(1)-(24)) that generate check-node messages $R_{mn}$ based on the MIN1, MIN2, MIN1_ID, and sign $s_{nm}$ values generated by CNUs 404(1)-(24). R selectors 408(1)-(24) generate check-node messages $R_{mn}$ as soon as the values are received from CNUs 404(1)-(24). R selectors 422(1)-(24), which generate analogous check-node messages $R_{mn}$ as R selectors 408(1)-(24), on the other hand, generate the check-node messages $R_{mn}$ after the MIN1, MIN2, MIN1_ID, and sign $s_{nm}$ values have been stored for 5,500 clock cycles. Using R selectors 422(1)-(24) enables min memory 416 to store only 13 bits per check node (i.e., row) of H-matrix 300 of FIG. 3 (i.e., four bits for MIN1, four bits for MIN2, four bits for MIN1_ID, and one bit for sign product 522). As an alternative, min memory 416 could store all eleven check-node messages $R_{mn}$ (11 messages×5 bits/message=55 bits) generated for each check node (i.e., row) of H-matrix 300 of FIG. 3. This would eliminate the need for R selectors 422(1)-(24); however, the size of min memory 416 would need to be increased relatively significantly.

Every 11 clock cycles, 24×13 bits are written into min memory 416, which stores 13 bits for each of the 12,000 check nodes (i.e., rows) of H-matrix 300 of FIG. 3, and 24×13 bits are read out of min memory 416. The bits read out of min memory 416 may correspond to (i) an iteration or (ii) a codeword that is different from the bits written into min memory 416. Min memory 416 may be implemented, for example, as dual-port RAM with 12,000 addresses, each having a width equal to 13 bits. The sets of 24×13 bits are written such that the bits corresponding to the first check node of H-matrix 300 are always written to address 0, the bits corresponding to the second check node of H-matrix 300 are always written to address 1, the bits corresponding to the third check node of H-matrix 300 are always written to address 2, and so on. As an alternative, min memory 416 may be implemented as two half-sized single-port RAMs, each having 6,000 addresses. The read and write ports of the two half-sized single-port RAMs may be operated in an alternating fashion similar to that of $L(q_n)$ memory 800 described below in relation to FIG. 8. As another alternative, min memory 416 may be implemented as one single-port RAM having twice the width and half the number of addresses as the dual-port RAM described above.

Sign memory 414, which stores 132,000 bits, receives 24 sign bits ($\text{sign}(L(q_{nm}))$) during each clock cycle, one from each CNU 404, and outputs 24 sign bits ($\text{sign}(L(q_{nm}))$) during each clock cycle that are 5,500 clock cycles old. Each of the 24 sign bits output are provided to a different R selector 422. Similar to min memory 416, the bits read out of sign memory 414 may correspond to (i) an iteration or (ii) a codeword that is different from the bits written into sign memory 414. Sign memory 414 may be implemented, for example, as dual-port RAM comprising 5,500 addresses (i.e., 132,000 bits/24 bits per address), each address having a width of 24 bits. The sign bits may be written such that the bits corresponding to the $1^{st}$ through $24^{th}$ check nodes of H-matrix 300 are always written to address 0, the bits corresponding to the $25^{th}$ through $48^{th}$ check nodes are always written to address 1, the bits corresponding to the $49^{th}$ through $72^{nd}$ check nodes are always written to address 2, and so on.

As an alternative, sign memory 414 may be implemented as single-port RAM having a width equal to four times (i.e., 4×24 bits) that of the dual-port RAM described above, and which is clocked at half of the full clock speed of LDPC decoder 400. In such implementations, 4×24 bits may be read out of the single-port RAM during a first set of two full clock cycles (i.e., 24 bits per half clock cycle) and 4×24 bits may be written to the single-port RAM during a second set of two full clock cycles (i.e., 24 bits per half clock cycle). Thus, 4×24 bits are read out and 4×24 bits are written to the single-port RAM every four full clock cycles.

Figure 6:
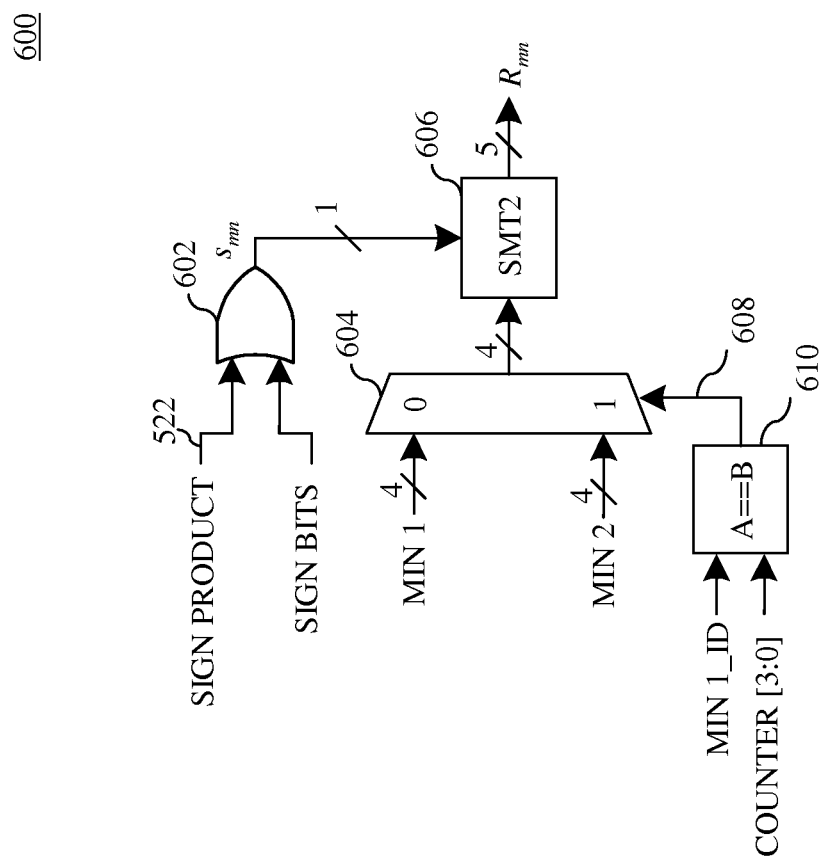
FIG. 6 shows a simplified block diagram of an R selector according to one embodiment of the present invention that may be used to implement the R selectors of the LDPC decoder of FIG. 4.

FIG. 6 shows a simplified block diagram of an R selector 600 according to one embodiment of the present invention that may be used to implement R selectors 408(1)-(24) and 422(1)-(24) of LDPC decoder 400 of FIG. 4. R selector 600 receives 24×13 bits (four bits for MIN1, four bits for MIN2, four bits for MIN1_ID, and one bit for sign product 522) from either a CNU 404 or min memory 416 every 11 clock cycles, and generates 11 check-node messages $R_{mn}$ at a rate of one message per clock cycle. Multiplexer 604, which receives MIN1 via its upper input and MIN2 via its lower input, outputs either MIN1 or MIN2 during each of 11 clock cycles based on a control signal 608. Control signal 608 is generated by comparator 610, which compares MIN1_ID to a four-bit counter value (Counter[3:0]). If MIN1_ID is equal to the counter value, then control signal 608 is asserted (i.e., set equal to 1) such that the lower input of multiplexer 604 is output to sign-magnitude-to-two's-complement (SMT2) converter 606. Otherwise, control signal 608 is de-asserted (i.e., set equal to zero) such that the upper input of multiplexer 604 is output to SMT2 converter 606.

During each of the 11 clock cycles, SMT2 converter 606 receives a different sign product $s_{mn}$ from OR gate 602. Each sign product $s_{mn}$ is generated as shown in Equation (3) by applying both (i) the sign product (e.g., 522) generated by a CNU and (ii) a sign bit (the MSB of a variable-node message $L(q_{nm})$) received from a sign memory 414 or delay buffer 406 of FIG. 4 to OR gate 602. SMT2 converter 606 appends sign product $s_{mn}$ to the MIN1 or MIN2 value received to produce a five-bit sign-magnitude check-node message $R_{mn}$, and converts the resulting sign-magnitude check-node message $R_{mn}$ into two's-complement format.

Referring back to FIG. 4, adders 410(1)-(24) receive check-node messages $R_{mn}$ from R selectors 408(1)-(24) at a rate of 24 messages per clock cycle, such that each adder 410 receives a different one of the 24 check-node messages $R_{mn}$. Each adder 410 adds the check-node message $R_{mn}$ that it receives to a corresponding variable-node message $L(q_{nm})$ received from delay buffer 406 to generate a soft-output message $L(q_n)$ as shown below in Equation (4):

$$L(q_n)=L(q_{nm})+R_{mn} \quad (4)$$

The soft-output messages $L(q_n)$, each of which corresponds to one bit of the encoded codeword, are provided to $L(q_n)$ memory 418 at a rate of 24 messages per clock cycle, and are written to addresses of $L(q_n)$ memory 418 (discussed below in relation to FIG. 8) that are provided by ROM 420. Additionally, the sign bits (i.e., the hard decisions $\hat{x}_n$) of the soft-output messages $L(q_n)$ are provided to syndrome calculator 412 (discussed below in relation to FIG. 7) at a rate of 24 bits per clock cycle. A total of 33,000 soft-output messages $L(q_n)$ and 33,000 hard decisions $\hat{x}_n$ are generated each time that a layer of H-matrix 300 is processed by LDPC decoder 400. One layer of H-matrix 300 is processed for each pass (i.e., 1,375 clock cycles) of LDPC decoder 400, and one iteration of LDPC decoder 400 is performed every four passes (i.e., 4×1, 375 clock cycles). Thus, each iteration of LDPC decoder 400 updates the set of 33,000 soft-output messages $L(q_n)$, and consequently the set of 33,000 hard decisions $\hat{x}_n$, four times.

Syndrome calculator 412 performs a parity check to determine whether LDPC decoder 400 has converged on a valid codeword. In general, if $\hat{x}H^T=0$, where $H^T$ is the transpose of H-matrix 300 of FIG. 3 and $\hat{x}$ is a 33,000-element vector formed from the 33,000 hard-decision bits $\hat{x}_n$, then LDPC decoder 400 has converged on a valid codeword. If $\hat{x}H^T \neq 0$, then decoding continues until $\hat{x}H^T=0$ or a predefined number of iterations are implemented. Note that the syndrome check is performed each time a layer of H-matrix 300 is processed by LDPC decoder 400, and, as a result, the decoding process may be terminated after any layer of H-matrix 300 is processed. Thus, the decoding process may terminate before the current iteration of LDPC decoder 400 is complete (i.e., before all four layers of H-matrix 300 are processed). If the decoding process does not end within a predefined number of iterations, then the received codeword has not been properly decoded.

During each clock cycle, L($q_n$) memory 418 provides sets of 24 soft-output messages L($q_n$) to barrel shifter 424. Barrel shifter 424 cyclically shifts the messages that it receives based on a shift signal that may be received from, for example, ROM 420. The cyclic-shift signal corresponds to cyclic-shift factors of the sub-matrices of H-matrix 300 of FIG. 3. Note that the sub-matrices of the first layer of H-matrix 300 are identity matrices that are not cyclically shifted. Thus, for the soft-output messages L($q_n$) that correspond to the first layer, the cyclic-shift signal is set to zero such that these messages are not cyclically shifted. Barrel shifter 424 outputs sets of 24 cyclically-shifted soft-output messages L($q_n$). If syndrome calculator 412 determines that decoding is complete, then the sign bits of each of the 24 cyclically-shifted soft-output messages L($q_n$) (i.e., the hard outputs) are provided to downstream processing.

Adders 426(1)-(24) receive (i) 24 cyclically-shifted soft-output messages L($q_n$) per clock cycle from barrel shifter 424 and (ii) 24 check-node messages $R_{mn}$ per clock cycle from R selectors 422(1)-(24). Each adder 426 subtracts a check-node message $R_{mn}$ from a corresponding cyclically-shifted soft-output message L($q_n$) to generate an updated variable-node (i.e., column) message L($q_{nm}$) as shown below in Equation (5):

$$L(q_{nm}) = L(q_n) - R_{mn} \quad (5)$$

The updated variable-node messages L($q_{nm}$) are subsequently provided to the upper input of multiplexer 402 at a rate of 24 messages per clock cycle for use in processing the next layer of H-matrix 300 or the next iteration of LDPC decoder 400. Note that, as the updated variable-node messages L($q_{nm}$) are output from adders 426(1)-(24), multiplexer 402 selects the updated variable-node messages L($q_{nm}$), such that LDPC decoder 400 may begin processing the next layer, without having to wait until all of the updated variable-node messages L($q_{nm}$) are generated by adders 426(1)-(24).

Figure 7:
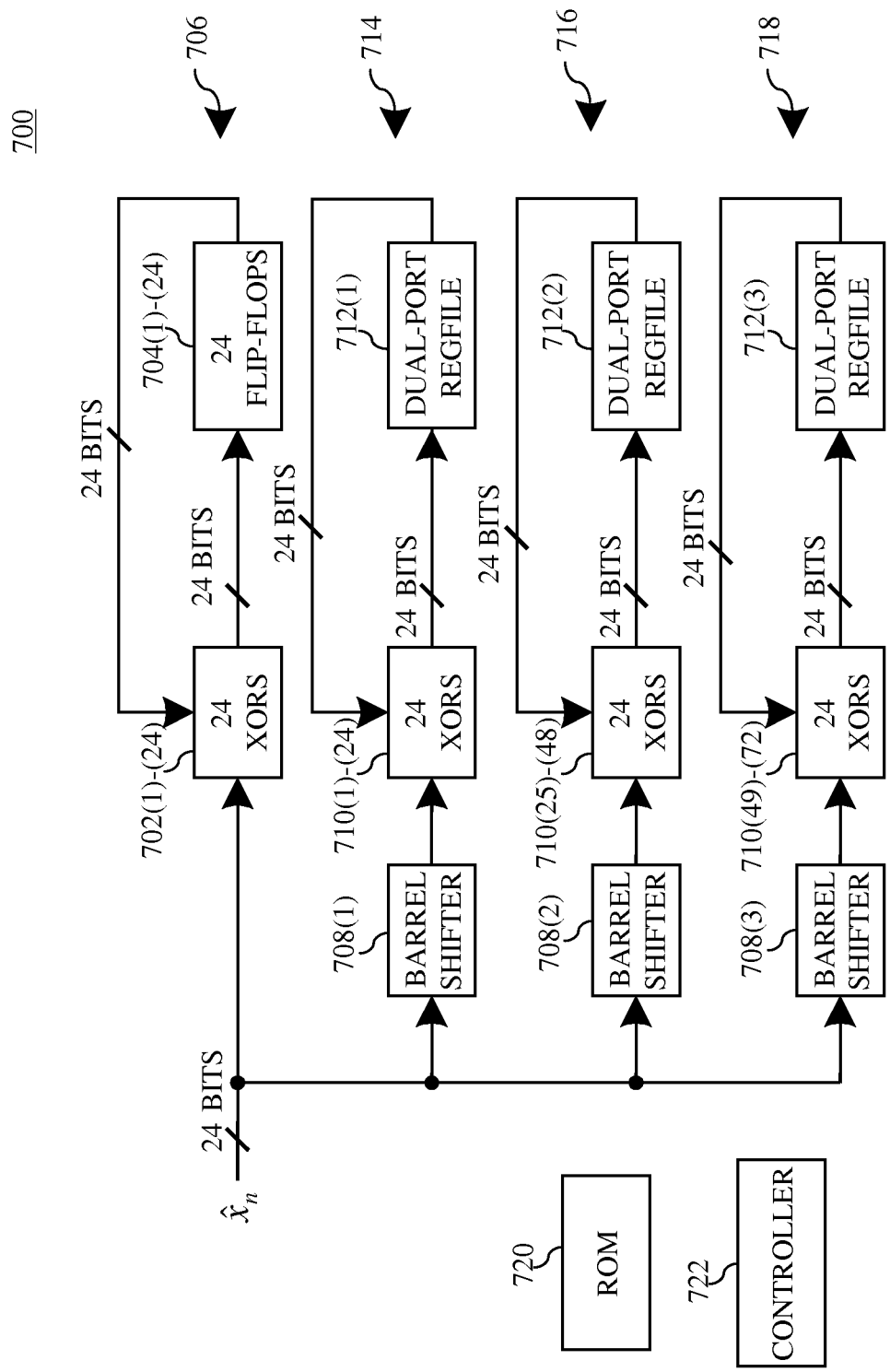
FIG. 7 shows a simplified block diagram of a syndrome calculator according to one embodiment of the present invention that may be used to implement the syndrome calculator of the LDPC decoder of FIG. 4.

FIG. 7 shows a simplified block diagram of a syndrome calculator 700 according to one embodiment of the present invention that may be used to implement syndrome calculator 412 of LDPC decoder 400 of FIG. 4. Syndrome calculator 700 updates the 12,000 parity-check equations (i.e., rows) of H-matrix 300 of FIG. 3 each time LDPC decoder 400 processes a layer of H-matrix 300 (i.e., every 33,000 bits÷24 bits/clock cycle=1,375 clock cycles). As a result, syndrome calculator 700 may determine whether the decoding process is finished after each layer is processed rather than waiting until all four layers have been processed (i.e., 1,375×4=5,500 clock cycles).

In general, during each clock cycle, syndrome calculator 700 receives 24 hard decisions $\hat{x}_n$, each corresponding to one parity-check equation (i.e., row) in each of the four layers of H-matrix 300 of FIG. 3. The 4×24 parity-check equations corresponding to the 24 hard decisions $\hat{x}_n$ are updated using four branches 706, 714, 716, and 718, which perform parity-check updates for layers one through four ($H_{LAYER1}$-$H_{LAYER4}$) of H-matrix 300, respectively.

In general, first branch 706 performs the parity-check updates for the first 24 rows of H-matrix 300 during the first 11 clock cycles, the updates for rows 25 through 48 during the $12^{th}$ through $22^{nd}$ clock cycles, the updates for rows 49 through 72 during the $23^{rd}$ through $33^{rd}$ clock cycles, and so on, until all parity-check equations of the first layer of H-matrix 300 have been updated. During the first clock cycle, the first set of 24 hard decisions $\hat{x}_n$ received corresponds to the first block column (i.e., the first 24 columns) of H-matrix 300. Since the sub-matrix corresponding to the first block row and first block column of H-matrix 300 (i.e., identity matrix $I_{1,1}$) is an identity matrix, the $1^{st}$ through $24^{th}$ hard decisions $\hat{x}_n$ of the first set correspond to the $1^{st}$ through $24^{th}$ parity-check equations (i.e., rows), respectively. Thus, the first set of hard decisions $\hat{x}_n$ is used to update the first 24 parity-check equations (i.e., rows). In so doing, the 24 hard decisions $\hat{x}_n$ are applied to XOR gates 702(1)-(24) along with 24 parity-check bits stored in flip-flops 704(1)-(24), such that one hard decision $\hat{x}_n$ and one parity-check bit are applied to each XOR gate 702. The 24 parity-check bits stored in flip-flops 704(1)-(24) may be initialized to 0. Each XOR gate 702 outputs an updated parity-check bit to a different one of the 24 flip-flops 704.

During the second clock cycle, a second set of 24 hard decisions $\hat{x}_n$ is received that corresponds to the second block column (i.e., columns 25 through 48) of H-matrix 300. Since the sub-matrix corresponding to the first block row and second block column of H-matrix 300 (i.e., identity matrix $I_{1,2}$) is an identity matrix, the $1^{st}$ through $24^{th}$ hard decisions $\hat{x}_n$ of the second set correspond to the $1^{st}$ through $24^{th}$ parity-check equations (i.e., rows), respectively. Thus, these hard decisions $\hat{x}_n$ are used to update the 24 parity-check bits corresponding to the first 24 rows of H-matrix 300 by applying the 24 hard decisions $\hat{x}_n$ to XOR gates 702(1)-(24) along with the 24 updated parity-check bits stored in flip-flops 704(1)-(24). This process is repeated for the third through $11^{th}$ clock cycles.

Once all 11 updates have been performed for the first block row, controller 722 determines whether all 24 parity-check bits stored in flip-flops 704(1)-(24) are equal to 0. In so doing, controller 722 may apply all 24 parity-check bits to an OR gate to generate a single-bit value. If the single-bit value is 1, then one or more of the 24 parity-check bits are equal to 1. In this case, the parity check is not satisfied for the first 24 parity-check equations, and LDPC decoder 400 may need to perform decoding for the next layer or perform another iteration to correctly decode the codeword. If the single-bit value is 0, then all of the 24 parity-check bits are equal to 0. In this case, the parity check is satisfied for the first 24 parity-check equations, and LDPC decoder 400 continues to determine whether the remaining parity-check equations of H-matrix 300 are satisfied. First branch 706 then repeats this process to perform the updates for the parity-check equations corresponding to identity matrices $I_{2,12}$ through $I_{2,22}$ during the $12^{th}$ through $22^{nd}$ clock cycles, followed by the updates for the parity-check equations corresponding to identity matrices $I_{3,23}$ through $I_{3,33}$ during the $23^{rd}$ through $33^{rd}$ clock cycles, and so on. Note that, for each new set of 24 parity-check equations processed, the flip-flops 704(1)-(24) are initialized to 0.

Typically, branches 714, 716, and 718 will perform the parity-check (i.e., row) updates in a more random order than that of first branch 706 because the second through fourth layers ($H_{LAYER2}$-$H_{LAYER4}$) of H-matrix 300 might not be arranged in the same pattern as the first layer ($H_{LAYER1}$). For example, as described above, the first set of 24 hard decisions $\hat{x}_n$ received during the first clock cycle correspond to the first block column (i.e., the first 24 columns) of H-matrix 300. However, these 24 hard decisions $\hat{x}_n$ might not, depending on the arrangement of the second layer ($H_{LAYER2}$), correspond to the first 24 parity-check equations (i.e., rows) of the second layer ($H_{LAYER2}$). Rather, they might correspond to, for example, the third set of 24 parity-check equations. During the second clock cycle, the second set of 24 hard decisions $\hat{x}_n$, which correspond to the second set of 24 columns, might, for example, correspond to the fifth set of 24 parity-check equations (i.e., rows) of the second layer ($H_{LAYER2}$). During the third clock cycle, the third set of 24 hard decisions $\hat{x}_n$, which correspond to the second set of 24 columns, might correspond to the third set of 24 parity-check equations (i.e., rows), the fifth set of 24 parity-check equations, or another set of 24 parity-check equations of the second layer ($H_{LAYER2}$). Thus, depending on the arrangement of the second layer ($H_{LAYER2}$), second branch 714 might not perform all 11 updates for each of the first 24 parity-check equations together. Rather, second branch 714 might jump around from one set of 24 parity-check equations to another set of 24 parity-check equations every clock cycle.

Branches 714, 716, and 718 process the sets of 24 hard decisions $\hat{x}_n$ that they receive in the same general manner using a barrel shifter (i.e., 708(1), 708(2), 708(3)), 24 XOR gates (i.e., 710(1)-(24), 710(25)-(48), and 710(49)-(72)), and a dual-port register file (i.e., 712(1), 712(2), 712(3)). For ease of discussion, the operation of branch 714 is described. This description may be extended to branches 716 and 718.

During each clock cycle, barrel shifter 708(1) cyclically shifts the set of 24 hard decisions n that it receives based on a cyclic-shift signal received from, for example, ROM 720. The cyclic-shift signal is based on the cyclic-shift factors of the sub-matrices of the second layer ($H_{LAYER2}$) of H-matrix 300. The 24 cyclically-shifted hard decisions $\hat{x}_n$ are applied to XOR gates 710(1)-(24) along with 24 parity-check bits stored in dual-port register file 712(1) to generate 24 updated parity-check bits that are subsequently stored in dual-port register file 712(1).

Dual-port register file 712(1), which stores 24×125 parity-check bits, one for each parity-check equation, has 125 addresses, one for each block row (i.e., set of 24 rows) of second layer ($H_{LAYER2}$) of H-matrix 300. Each address stores 24 parity-check bits, each corresponding to one parity-check equation (i.e., row) of the second layer ($H_{LAYER2}$). All 24×125 parity-check bits are stored because, as described above, branch 714 might perform the 11 updates for each of the parity-check equations in a random order rather than performing the 11 updates consecutively. The sets of 24 parity-check bits are read from and written to addresses of dual-port register file 712(1) provided by controller 722 and may be initialized to 0 during the first clock cycle.

Once all 11 updates have been performed for each of the 24×125 parity-check equations of branch 714, controller 722 determines whether the 24×125 parity-check bits are equal to 0. In so doing, controller 722 may apply all 24×125 parity-check bits to an OR gate to generate a single-bit value. If the single-bit value is 1, then one or more of the 24×125 parity-check bits are equal to 1. In this case, the parity check is not satisfied for the second layer ($H_{LAYER2}$), and LDPC decoder 400 may need to perform decoding for the next layer or perform another iteration to correctly decode the codeword. If the single-bit value is 0, then all of the 24×125 parity-check bits are equal to 0. In this case, the parity check is satisfied for the second layer ($H_{LAYER2}$). The same process is performed for layers three and four ($H_{LAYER3}$, $H_{LAYER4}$) of H-matrix 300 in parallel with layers one and two ($H_{LAYER1}$, $H_{LAYER2}$), and, if syndrome calculator 700 determines that the parity-check bits for all four layers are satisfied, then decoding is complete. Otherwise, decoding continues for another layer or iteration. Alternatively, the 24×125 parity-check bits can be applied to a 24-operand OR gate sequentially as follows: Whenever all 11 updates have been performed for a certain group of 24 parity checks, then apply these updated 24 parity checks to a 24-operand OR gate and check the single-bit value of the OR-gate.

Figure 8:
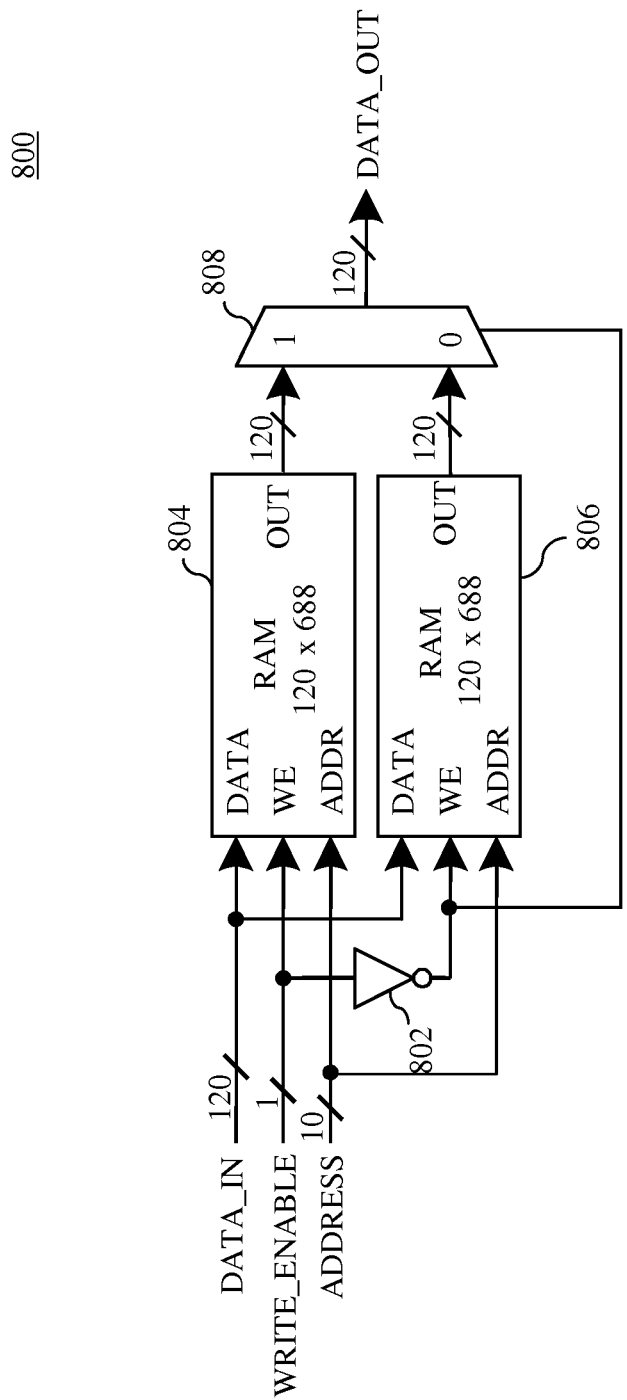
FIG. 8 shows a simplified block diagram of an $L(q_n)$ memory according to one embodiment of the present invention that may be used to implement the $L(q_n)$ memory of the LDPC decoder of FIG. 4.

FIG. 8 shows a simplified block diagram of $L(q_n)$ memory 800 according to one embodiment of the present invention that may be used to implement $L(q_n)$ memory 418 of LDPC decoder 400 of FIG. 4. During each clock cycle, 24 soft-output messages $L(q_n)$ (i.e., 24 messages×5 bits/message=120 bits) are written to $L(q_n)$ 800 and 24 soft-output messages $L(q_n)$ are read from $L(q_n)$ memory 800. $L(q_n)$ memory 800 may be implemented using two single-port RAMs 804 and 806, each having a width 120 bits and depth of 688 bits. Single-port RAMs 804 and 806 are operated in alternating fashion such that, when RAM 804 is in read mode, RAM 806 is in write mode, and when RAM 804 is in write mode, RAM 806 is in read mode. RAM 804 and RAM 806 are organized such that the 24 soft-output messages $L(q_n)$ corresponding to the $1^{st}$ through $24^{th}$ variable nodes (i.e., columns) of H-matrix 300 of FIG. 3 are stored in address 0 of RAM 804, the 24 soft-output messages $L(q_n)$ corresponding to the $25^{th}$ through $48^{th}$ variable nodes are stored in address 0 of RAM 806, the 24 soft-output messages $L(q_n)$ corresponding to the $49^{th}$ through $72^{nd}$ variable nodes are stored in address 1 of RAM 804, the 24 soft-output messages $L(q_n)$ corresponding to the $73^{rd}$ through $96^{th}$ variable nodes are stored in address 1 of RAM 806, and so on.

RAM 804 and RAM 806 each have (i) a data input port (Data) that receives sets of 24 soft-output messages $L(q_n)$ (i.e., 120 bits), (ii) a write enable port (WE) that receives a write enable control signal (Write_Enable) from, for example, a controller, (iii) an address input port (Addr) that receives ten-bit addresses from, for example, ROM 420 of FIG. 4, and (iv) an output port (Out) that provides sets of 24 soft-output messages $L(q_n)$ to multiplexer 808. When Write_Enable is asserted (i.e., set equal to 1), the write mode of RAM 804 is enabled such that the current set of 24 soft-output messages $L(q_n)$ is written to the address of RAM 804 received at its address port. Inverter 802 inverts Write_Enable (i.e., sets Write_Enable equal to 0) and provides inverted Write_Enable to the enable port of RAM 806 and the control port of multiplexer 808. As a result, the write mode of RAM 806 is not enabled, and multiplexer 808 outputs its lower input received from RAM 806. When Write_Enable is de-asserted (i.e., set equal to 0), the write mode of RAM 804 is not enabled. Inverter 802 inverts Write_Enable (i.e., sets Write_Enable equal to 1) and provides inverted Write_Enable to the enable port of RAM 806 and the control port of multiplexer 808. As a result, the write mode of RAM 806 is enabled such that the current set of 24 soft-output messages $L(q_n)$ is written to the address of RAM 806 received at its address port, and multiplexer 808 outputs its upper input received from RAM 804.

Figure 9:
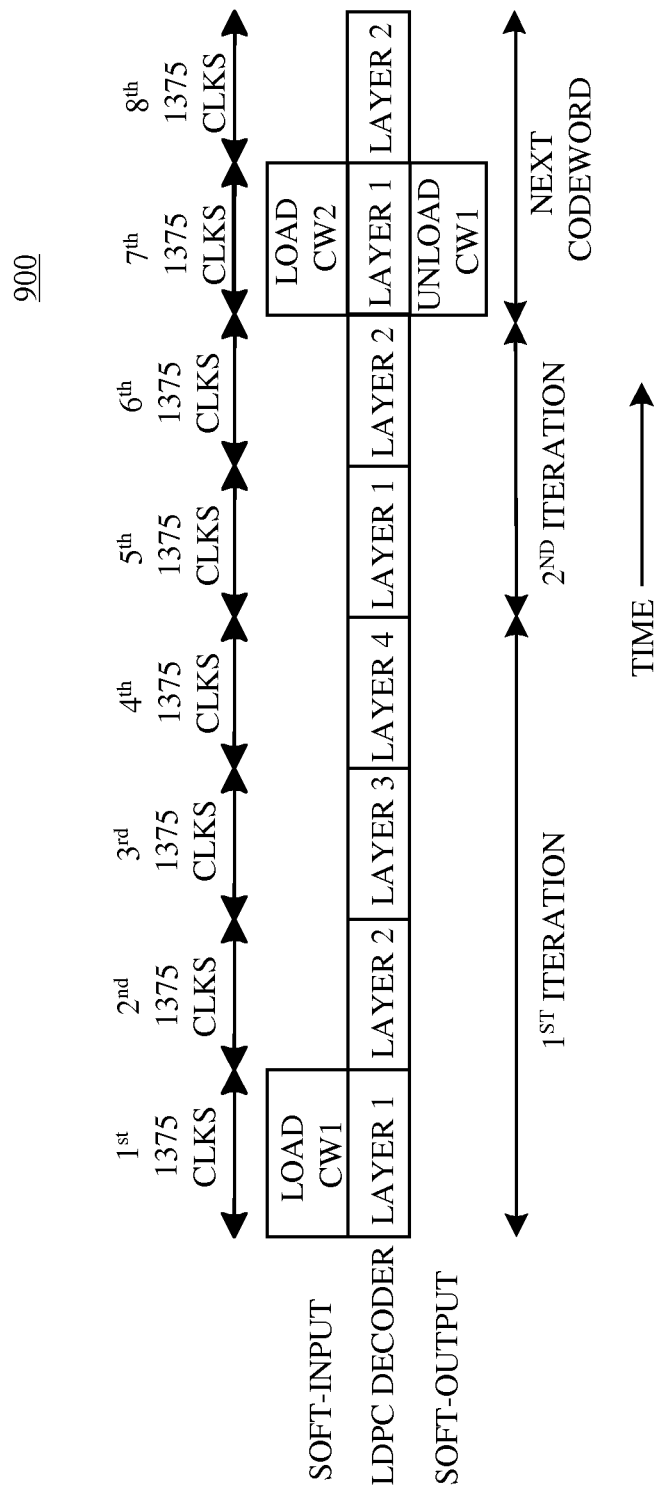
FIG. 9 graphically illustrates an exemplary timing diagram for the LDPC decoder of FIG. 4 according to one embodiment of the present invention.

FIG. 9 graphically illustrates an exemplary timing diagram 900 for LDPC decoder 400 of FIG. 4 according to one embodiment of the present invention. During the first 1,375 clock cycles of the first iteration for a first codeword (CW1), the 33,000 soft values $L_n^{(0)}$ corresponding to CW1 are loaded into LDPC decoder 400 via multiplexer 402, and at the same time, LDPC decoder 400 performs the message updating for layer 1 of H-matrix 300 of FIG. 3. Thus, LDPC decoder 400 begins decoding CW1 as soon as it starts receiving soft values $L_n^{(0)}$. During the second through fourth sets of 1,375 clock cycles, LDPC decoder 400 completes the first iteration by performing the message updates for the second through fourth layers ($H_{LAYER2}$-$H_{LAYER4}$) of H-matrix 300, respectively.

During the $5^{th}$ through $6^{th}$ sets of 1,375 clock cycles, LDPC decoder 400 performs the second iteration by updating the messages corresponding to the first through second layers ($H_{LAYER1}$-$H_{LAYER2}$), respectively. In this example, CW1 is successfully decoded at the end of the second layer ($H_{LAYER2}$). Thus, decoding is terminated before processing of the second iteration is complete. Note that, in practice, codewords may be successfully decoded during the processing of other layers or iterations or they might not be successfully decoded at all. During the seventh set of 1,375 clock cycles, the 33,000 soft values $L_n^{(0)}$ corresponding to a second codeword (CW2) are loaded into LDPC decoder 400 via multiplexer 402. At the same time, LDPC decoder 400 (i) performs the message updating for CW2 corresponding to the first layer ($H_{LAYER1}$) of H-matrix 300 of FIG. 3, and (ii) unloads CW1 by outputting the hard outputs to downstream processing. Thus, LDPC decoder 400 begins decoding CW2 as soon as it starts receiving soft values $L_n^{(0)}$.

Since CW1 is unloaded at the same time that CW2 is loaded, the unloading of CW1 adds little to no delay to the decoding of CW2. However, note that up to 11 idle clock cycles might be needed between each set of 1,375 clock cycles to update the soft-output messages $L(q_n)$ depending on the arrangement of the sub-matrices of H-matrix 300. In generating the layers of H-matrix 300, the sub-matrices may be arranged to minimize or even eliminate the number of idle clock cycles.

It will be further understood that various changes in the details, materials, and arrangements of the parts which have been described and illustrated in order to explain the nature of this invention may be made by those skilled in the art without departing from the scope of the invention as expressed in the following claims. For example, embodiments of the present invention may be envisioned in which barrel shifter 424 is positioned upstream of $L(q_n)$ memory 418, rather than downstream of $L(q_n)$ memory 418. Further, rather than using two sets of 24 R selectors (e.g., 408(1)-(24) and 422(1)-(24)), embodiment the present invention may use (i) one set of 24 R selectors (e.g., 408(1)-(24)) and (ii) additional memory to store all of the check-node messages generated by the set of 24 R selectors for processing later in time by adders 426(1)-(24). As another example, embodiments of the present invention may be envisioned that implement a suitable check-node algorithm other than the min-sum check-node algorithm.

Although one embodiment has been described for each block of hardware of LDPC decoder 400 of FIG. 4, the present invention is not limited to those embodiments. For example, syndrome calculator 412 may be implemented using any suitable parity-check calculator that determines whether the LDPC decoder has converged on a valid codeword. According to various alternative implementations, syndrome calculator 412 may update the syndrome for all parity-check equations only when the sign of a soft-output messages $L(q_n)$ changes. In so doing, the throughput of syndrome calculator 412 may be increased. According to other alternative implementations, syndrome calculator 412 may be constructed to perform the parity-check updates for only one layer of H-matrix 300 at a time, as opposed to syndrome calculator 700, which performs the parity-check updates for all four layers concurrently. Such syndrome calculators might, for example, implement only one of the branches of syndrome calculator 700. This could reduce the area of the syndrome calculator 700 of FIG. 7 but could increase latency. According to yet other alternative implementations, syndrome calculator 412 may be replaced by or used in addition to a cyclic-redundancy check (CRC) calculator that calculates the CRC of the hard-decision bits corresponding to soft-output messages $L(q_n)$ and uses the result as a convergence check. For example, after syndrome calculator 412 determines that LDPC decoder 400 has converged on a valid codeword, a CRC calculator may be used to determine whether LDPC decoder 400 has converged on the correct codeword.

As described above, various embodiments of the first layer ($H_{LAYER1}$) of H-matrix 300 may be envisioned that support processing of soft-output values without having to wait for all of the soft-output values to be generated. As an example, various embodiments may be envisioned in which groups of 11 identity matrices are not arranged along the diagonal as is shown in FIG. 3B, but rather, are arranged more randomly. For example, the identity matrices corresponding to block columns 1 to 11 may be located in block row 5, the eleven identity matrices corresponding to block columns 2 to 22 may be located in block row 8, the eleven identity matrices corresponding to block columns 23 to 33 may be located in block row 1, and so on. In such embodiments, the LDPC decoder processes the check nodes (i.e., rows) in a more-random fashion (e.g., performs the check node updates for block row 5, followed by block row 8, followed by block row 1, and so on).

As another example, the eleven identity matrices in each block row may be separated by, for example, zero matrices. For example, the eleven identity matrices in the first block row may be located in block columns 1, 3, . . . , 21, with zero matrices in block columns 2, 4, . . . , 22, and the eleven identity matrices in the second block row may be located in block columns 2, 4, . . . , 22, with zero matrices in block columns 1, 3, . . . , 21. Such embodiments may require a buffer, for example, at the inputs of multiplexer 402.

As yet another example, various embodiments may be envisioned in which sub-matrices of the first layer ($H_{LAYER1}$) are implemented as circulants rather than identity matrices. Such embodiments may require additional hardware, such as an additional barrel shifter upstream of multiplexer 402.

The present invention may be implemented for various H-matrices that are the same size as or a different size from H-matrix 300 of FIG. 3. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 300. In such embodiments, the number of VNUs, barrel shifters, and/or CNUs may vary according to the characteristics of the H-matrix.

While the present invention was described relative to its use with regular H-matrices (i.e., H-matrices wherein the hamming weights of all columns are the same and the hamming weight of all rows are the same), the present invention is not so limited. The present invention may also be implemented for H-matrices that are irregular (i.e., H-matrices wherein the hamming weights of all columns are not the same and the hamming weight of all rows are not the same).

Further, the present invention is not limited to use with quasi-cyclic H-matrices. VNUs and LDPC decoders of the present invention may be used with H-matrices that are either partially quasi-cyclic or fully non-cyclic. Partially quasi-cyclic LDPC codes are LDPC codes that comprise (i) one or more cyclic sub-matrices that are either equal to an identity matrix or are obtained by cyclically shifting an identity matrix and (ii) one or more non-cyclic sub-matrices that are not equal to an identity matrix and can not be obtained by cyclically shifting an identity matrix. LDPC codes that are fully non-cyclic do not have any cyclic sub-matrices. In various embodiments that employ either partially quasi-cyclic or fully non-cyclic H-matrices, the VNUs and check node units (CNUs) may be interconnected using, for example, fixed connections or programmable cross-bars in lieu of barrel shifters.

The present invention is also not limited to receiving and processing log-likelihood ratios. Various embodiments of the present invention may be envisioned in which other soft values, such as likelihood ratios, or hard bit decisions are processed.

Further, the present invention is not limited to use with the layered LDPC decoder configuration of FIG. 4. LDPC decoder configurations other than LDPC decoder 400 may be implemented to process soft-output values or hard-decision bits, without having to wait until all of the soft-output values or hard-decision bits are generated by upstream processing.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

I claim:

1. An apparatus comprising a decoder for decoding error-correction encoded codewords, the decoder comprising:
    a check-node unit adapted to:
        receive an initial set of initial values generated by an upstream processor, wherein:
            the initial set corresponds to a first error-correction-encoded codeword; and
            each initial value in the initial set corresponds to a different bit of the first error-correction-encoded codeword; and
        initiate generating check-node messages based on one or more initial values in the initial set before the upstream processor generates all of the initial values in the initial set;
    a combiner adapted to generate an updated set of updated values corresponding to the bits of the first error-correction-encoded codeword based on the check-node messages and the initial values generated by the upstream processor; and
    a parity-check calculator adapted to determine whether the updated values correspond to a valid codeword, wherein:
    the apparatus further comprises the upstream processor; and
    the upstream processor transmits the initial set of initial values to the decoder without storing all of the initial values in the initial set in memory.

2. The apparatus of claim 1, wherein the initial values are soft values, each soft value comprising a hard-decision bit and a multi-bit confidence value.

3. The apparatus of claim 1, wherein the first error-correction-encoded codeword is a low-density parity-check encoded codeword, and the decoder is a low-density parity-check decoder.

4. The apparatus of claim 1, wherein the decoder is a layered decoder.

5. An apparatus comprising a decoder for decoding error-correction encoded codewords, the decoder comprising:
    a check-node unit adapted to:
        receive an initial set of initial values generated by an upstream processor, wherein:
            the initial set corresponds to a first error-correction-encoded codeword; and
            each initial value in the initial set corresponds to a different bit of the first error-correction-encoded codeword; and
        initiate generating check-node messages based on one or more initial values in the initial set before the upstream processor generates all of the initial values in the initial set;
    a combiner adapted to generate an updated set of updated values corresponding to the bits of the first error-correction-encoded codeword based on the check-node messages and the initial values generated by the upstream processor, wherein the combiner is adapted to begin generating the updated set before the upstream processor generates all of the initial values in the initial set; and
    a parity-check calculator adapted to determine whether the updated values correspond to a valid codeword.

6. The apparatus of claim 5, wherein the parity-check calculator is adapted to begin determining whether the updated values correspond to a valid codeword before the upstream processor generates all of the initial values in the initial set.

7. An apparatus comprising a decoder for decoding error-correction encoded codewords, the decoder comprising:
a check-node unit adapted to:
receive an initial set of initial values generated by an upstream processor, wherein:
the initial set corresponds to a first error-correction-encoded codeword; and
each initial value in the initial set corresponds to a different bit of the first error-correction-encoded codeword; and
initiate generating check-node messages based on one or more initial values in the initial set before the upstream processor generates all of the initial values in the initial set;
a combiner adapted to generate an updated set of updated values corresponding to the bits of the first error-correction-encoded codeword based on the check-node messages and the initial values generated by the upstream processor; and
a parity-check calculator adapted to determine whether the updated values correspond to a valid codeword, wherein the first error-correction-encoded codeword has been encoded based on a parity-check matrix comprising a first layer that supports initiating generating check-node messages based on the initial values before the upstream processor generates all of the initial values in the initial set.

8. The apparatus of claim 7, wherein:
the first layer of the parity-check matrix comprises a plurality of rows;
each row in the first layer comprises a plurality of non-zero sub-matrices and a plurality of zero sub-matrices; and
the non-zero sub-matrices in each row of the first layer are arranged such that no two non-zero sub-matrices are separated by a zero sub-matrix.

9. The apparatus of claim 8, wherein each non-zero sub-matrix is either an identity matrix or a circulant obtained by cyclically shifting the identity matrix.

10. The apparatus of claim 8, wherein:
the first layer of the parity-check matrix comprises a plurality of columns; and
no column in the first layer comprises more than one non-zero sub-matrix.

11. The apparatus of claim 8, wherein the check-node unit performs the check-node updates for the plurality of rows in the first layer such that the check-node updates for each row in the first layer are completed before the check-node updates for any other row in the first layer are initiated.

12. An apparatus comprising a decoder for decoding error-correction encoded codewords, the decoder comprising:
a check-node unit adapted to:
receive an initial set of initial values generated by an upstream processor, wherein:
the initial set corresponds to a first error-correction-encoded codeword; and
each initial value in the initial set corresponds to a different bit of the first error-correction-encoded codeword; and
initiate generating check-node messages based on one or more initial values in the initial set before the upstream processor generates all of the initial values in the initial set;
a combiner adapted to generate an updated set of updated values corresponding to the bits of the first error-correction-encoded codeword based on the check-node messages and the initial values generated by the upstream processor; and
a parity-check calculator adapted to determine whether the updated values correspond to a valid codeword, wherein:
the decoder is a layered decoder;
the first error-correction-encoded codeword is encoded using a parity-check matrix has a first layer and one or more other layers; and
the parity-check calculator is adapted to determine whether the updated set of updated values for the first layer corresponds to a valid codeword before the check-node unit completes the check-node updates for the one or more other layers.

13. The apparatus of claim 12, wherein:
the parity-check calculator is adapted to determine whether the updated set of updated values for the first layer corresponds to the valid codeword before the check-node unit initiates the check-node updates for any other layer.

14. An apparatus comprising a decoder for decoding error-correction encoded codewords, the decoder comprising:
a check-node unit adapted to:
receive an initial set of initial values generated by an upstream processor, wherein:
the initial set corresponds to a first error-correction-encoded codeword; and
each initial value in the initial set corresponds to a different bit of the first error-correction-encoded codeword; and
initiate generating check-node messages based on one or more initial values in the initial set before the upstream processor generates all of the initial values in the initial set;
a combiner adapted to generate an updated set of updated values corresponding to the bits of the first error-correction-encoded codeword based on the check-node messages and the initial values generated by the upstream processor; and
a parity-check calculator adapted to determine whether the updated values correspond to a valid codeword, wherein:
the decoder is adapted to decode a subsequent error-correction-encoded codeword;
the decoder is further adapted to output a set of hard-decision values, each hard-decision value in the set corresponding to a different bit of the first error-correction-encoded codeword; and
the check-node unit is further adapted to:
receive an initial set of initial values generated by the upstream processor corresponding to the subsequent error-correction-encoded codeword; and
initiate generating check-node messages based on the initial set of initial values for the subsequent error-correction-encoded codeword before the decoder has output all of the hard-decision values for the first error-correction-encoded codeword.

15. A method for decoding error-correction encoded codewords, the method comprising:
(a) receiving an initial set of initial values generated by a upstream processor, wherein:
the initial set corresponds to a first error-correction-encoded codeword; and
each initial value in the initial set corresponds to a different bit of the first error-correction-encoded codeword;

(b) initiating generating of check-node messages based on one or more initial values in the initial set before the upstream processor generates all of the initial values in the initial set;

(c) generating an updated set of updated values corresponding to the bits of the first error-correction-encoded codeword based on the check-node messages and the initial values generated by the upstream processor; and (d) determining whether the updated values correspond to a valid codeword, wherein in step (a), the initial set of initial values is received from the upstream processor without first storing all of the initial values in the initial set in memory.

16. A method for decoding error-correction encoded codewords, the method comprising:

(a) receiving an initial set of initial values generated by a upstream processor, wherein:

the initial set corresponds to a first error-correction-encoded codeword; and each initial value in the initial set corresponds to a different bit of the first error-correction-encoded codeword;

(b) initiating generating of check-node messages based on one or more initial values in the initial set before the upstream processor generates all of the initial values in the initial set;

(c) generating an updated set of updated values corresponding to the bits of the first error-correction-encoded codeword based on the check-node messages and the initial values generated by the upstream processor; and (d) determining whether the updated values correspond to a valid codeword, wherein the first error-correction-encoded codeword has been encoded based on a parity-check matrix comprising a first layer that supports initiating generating check-node messages based on the initial values before the upstream processor generates all of the initial values in the initial set.

17. A receiver comprising:

a upstream processor adapted to generate an initial set of initial values, wherein:

the initial set corresponds to a first low-density parity-check-encoded codeword; and each initial value in the initial set corresponds to a different bit of the first low-density parity-check-encoded codeword; and an low-density parity-check decoder adapted to:

receive the initial values; and begin to decode the initial values before the upstream processor generates all of the initial values in the initial set, wherein the upstream processor transmits the initial set of initial values to the decoder without storing all of the initial values in the initial set in memory.

* * * * *